(12) United States Patent
In (10) Patent No.: US 8,724,389 B2
(45) Date of Patent: May 13, 2014

(54) NON-VOLATILE SOLID STATE MEMORY-BASED MASS STORAGE DEVICE AND METHODS THEREOF

(75) Inventor: Ji-Hyun In, Fremont, CA (US)

(73) Assignee: OCZ Storage Solutions, Inc., San Jose, CA (US)

( * ) Notice: Subject to any disclaimer, the term of this patent is extended or adjusted under 35 U.S.C. 154(b) by 133 days.

(21) Appl. No.: 13/558,830

(22) Filed: Jul. 26, 2012

(65) Prior Publication Data

US 2014/0029341 A1     Jan. 30, 2014

(51) Int. Cl.
*G11C 16/04*     (2006.01)

(52) U.S. Cl.
USPC ............ 365/185.12; 365/185.17; 365/185.09; 365/185.33

(58) Field of Classification Search
USPC ............. 365/185.12, 185.17, 185.33, 185.09, 365/185.03
See application file for complete search history.

(56) References Cited

U.S. PATENT DOCUMENTS 8,385,120 B2*    2/2013    Jang et al. ................ 365/185.12

* cited by examiner

*Primary Examiner* — David Lam
(74) *Attorney, Agent, or Firm* — Hartman Global IP Law; Gary M. Hartman; Michael D. Winter (57) ABSTRACT

Non-volatile solid state mass storage device and methods for improving write performance thereof. The storage device includes a NAND flash controller, an array of NAND flash memory integrated circuits, and means for determining a lowest unused page number of each write target block in a group of the NAND flash memory integrated circuits that are simultaneously accessible at any given time by a write command. The storage device has further means for programming a dummy write to at least a first write target block in a first NAND flash memory integrated circuit within the group of NAND flash memory integrated circuits if the lowest unused page number within the first write target block is lower than the lowest unused page number of a second write target block in a second NAND flash memory integrated circuit in the group of NAND flash memory integrated circuits.

19 Claims, 7 Drawing Sheets

NON-VOLATILE SOLID STATE MEMORY-BASED MASS STORAGE DEVICE AND METHODS THEREOF

BACKGROUND OF THE INVENTION

The present invention generally relates to non-volatile data storage devices for use with computers and other processing apparatuses. More particularly, this invention relates to NAND flash-based solid state drives and performance optimizations thereof.

Mass storage devices such as advanced technology attachment (ATA) drives and small computer system interface (SCSI) drives are rapidly adopting non-volatile memory technology, such as flash memory or another emerging solid-state memory technology including phase change memory (PCM), resistive random access memory (RRAM), magnetoresistive random access memory (MRAM), ferromagnetic random access memory (FRAM) or organic memories. Currently, the most common solid-state technology uses NAND flash memory components as inexpensive storage memory, often in a form commonly referred to as a solid-state drive (SSD).

NAND flash memory comprises chains of floating gate transistors that store information by injecting electrons into the floating gate via Fowler Nordheim tunneling. The floating gate then augments or counteracts the control voltage applied to the control gate. Consequently, the voltage level applied to the control gate that is needed to cause the transistor to switch to a close state is equivalent to the bit value stored in the floating gate transistor, which comprises one cell of NAND flash memory.

The earliest generations of NAND flash were able to store a single bit in each cell, that is, because of relatively crude programming and sensing technology, only two levels of floating gate charge could be distinguished. This type of NAND flash memory is still used and generally referred to as single level cell (SLC) flash memory. Despite only being capable of storing a single bit in each cell, the relatively low requirements on the accuracy for programming and sensing, in combination with the advances in the control logic of the NAND flash memory device allows the current generations of SLC NAND flash to have increased operating speeds, operate with extremely low bit error rates, and further exhibit improved write endurance characteristics.

The drawback of using SLC NAND flash memory is that the area bit density is low. In contrast, multi-level cell (MLC) flash memory can store two bits in each cell by decoding four different switching voltage levels and tri-level cells (TLC) can store three bits in each cell. The number of voltage levels that need to be distinguishable is $2^n$ wherein n is the number of bits that can be stored in each cell. Accordingly, even though it is an apparent misnomer, TLC NAND flash needs to have enough programming and sensing granularity to unambiguously identify eight different switch voltage levels.

Instead of programming each MLC or TLC memory cell in a single sweep to the desired charge of the floating gate, the lower and upper bits are programmed separately. Each programming sweep creates a page. Lower bits of one programming cycle form a lower page referred to as a least significant bit (LSB) page. Upper or most significant bits (MSB) form a logically separate page, i.e., the upper page, in a subsequent programming cycle. In the case of TLC, a third level of granularity is added, resulting in a third page.

As discussed above, each higher level of bit and page requires exponentially more levels of voltage to be unambiguously identifiable. Inherently, this means higher precision of both programming and sensing as well as better immunity against level shifting through near-field effects and/or drifting of the floating gate charges because of leakage currents. In combination, these factors create the scenario where the higher precision and granularity comes at the expense of exponentially longer programming intervals with each additional level. In practice, in an exemplary NAND flash MLC integrated circuit, programming the lower page to the desired bit value may require 500 μsec, whereas programming the upper pages requires 1,650-2,100 μsec for the lower and upper plane corresponding to even or odd page numbers, respectively. In TLC, this trend continues with the highest level programming times reaching up to 4,000 μsec.

Modern flash controllers such as those deployed in SSDs typically use multiple channels to interface with the NAND flash memory array at the storage back-end. The different channels can operate as individual units or in unison but if several channels are working together as a group, their data transfers are synchronized. For example, if write or read operations are simultaneously executed over several channels, all channels will be part of the group and the controller will not issue a "Done" interrupt until all data are stable in the NAND flash. Inherently, this means that if data are written to a mixture of lower and upper pages and if the lower pages-writes are completed much faster than the upper page-writes then the group characteristics will force the faster (lower) channels to wait until the slower (upper) channels have completed the write command.

In most multi-channel flash controllers, the above discussed mixed group write comprising write commands to both lower and upper pages is not an exception but a typical situation, wherein a substantial amount of time is wasted in a "no channel left behind" implementation. Since all writes will be executed at the slowest channel's pace, write performance greatly suffers. With current MLC technology, this problem is only starting to emerge, however, at the latest with a more wide-spread acceptance of TLC NAND flash, this will create a serious write performance bottleneck. Accordingly, it is of utmost importance to develop new strategies to avoid dragging down of performance by speed mismatch of pages to be written to.

First iterations of MLC flash simply alternated lower and upper pages, for example, all lower pages had even page numbers, whereas all upper pages had odd page numbers. This simple interleaving of upper and lower pages has been superseded by more sophisticated page pairing patterns wherein typically at least two upper and two lower pages are paired in logically consecutive page numbers. Of particular importance in this case is the introduction of dual plane NAND flash integrated circuits wherein two physical pages are accessed in parallel through each read or write command. Optionally, higher numbers of functionally equivalent pages can be paired or a higher number of any subset of pages can be used to create an offset at the low end of each block. However, the pairing pattern for all NAND flash integrated circuits is at the discretion of the specific integrated circuit vendor and may vary across different designs.

Figure 1:
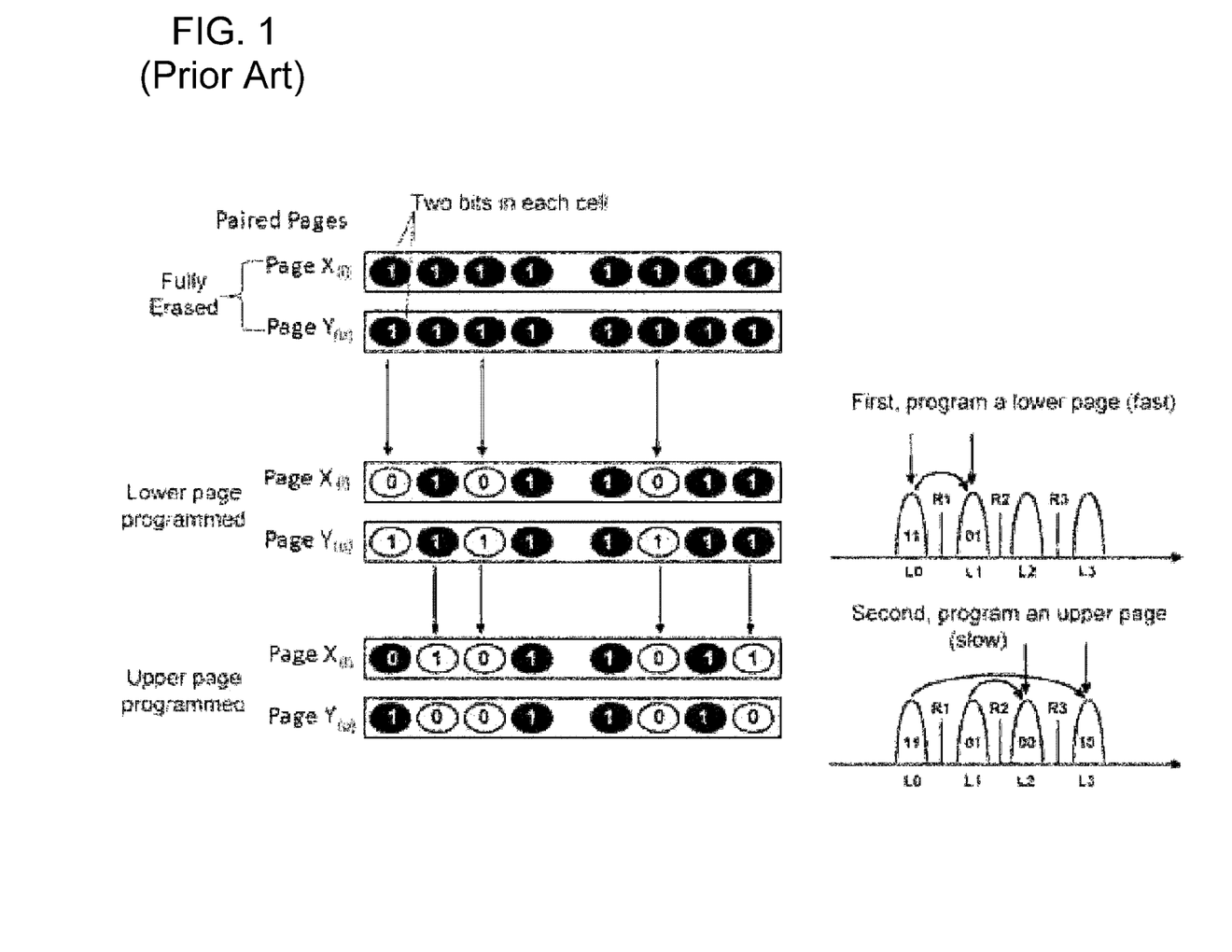
FIG. 1 represents the characteristics and write sequence to an MLC NAND flash memory.

A common programming bit storing pattern and programming sequence is represented in FIG. 1. A fully erased sequence of MLC NAND flash memory cells in which two bits can be stored in each cell is organized into pairs of pages, wherein Page $X_{(l)}$ refers to the lower page and Page $Y_{(u)}$ refers to the upper page. The first programming command will write to the lower page only, as represented by the change in bit value from 1 to 0 in the lower programmed page. As a result, the switching voltage level L0 will be changed to L1 above the read threshold R1 in cells having lower bits programmed from 1 to 0. The second programming command will subsequently write the upper bits to the upper pages, wherein, if the bit value is changed from 1 to 0, the voltage level is changed either from L0 to L3 or from L1 to L2, depending on whether the bit value of the lower cell was 1 or 0. All switching levels are separated from each other by reference points (R1-R3). Programming the upper pages takes substantially longer than programming the lower pages with additional latencies encountered for the odd pages located in the upper plane (plane 1).

In a typical write command, the host system writes several file system allocation units to the solid state drive. For purposes of this discussion, each file system allocation unit is considered to correspond to a page in a block of the NAND flash integrated circuit. The NAND flash controller features several channels, each of which is connected to a number of NAND flash integrated circuits, only one of which can be selected at any time via a chip enable signal and wherein the number of NAND flash integrated circuits that can be addressed by the flash controller equals the number of Chip Enable (CE) signal lines (unless bank-switching mechanisms expand the capacity of the array).

All channels enabled on a controller comprise a group and the highest performance for reading and writing data is achieved whenever an entire group is active, that is, all channels read or write simultaneously to one of the NAND flash integrated circuits.

One scenario often encountered in solid state drives using a plurality of channels for parallel access of multiple NAND flash integrated circuits is that the size of the data committed from the host does not align with the group boundaries. As a result, within the amount of time allowed for maintaining data within a volatile memory-based write combine buffer, not all channels are utilized and, by extension, not all pages within the write target blocks of the group are written to.

Figure 2:
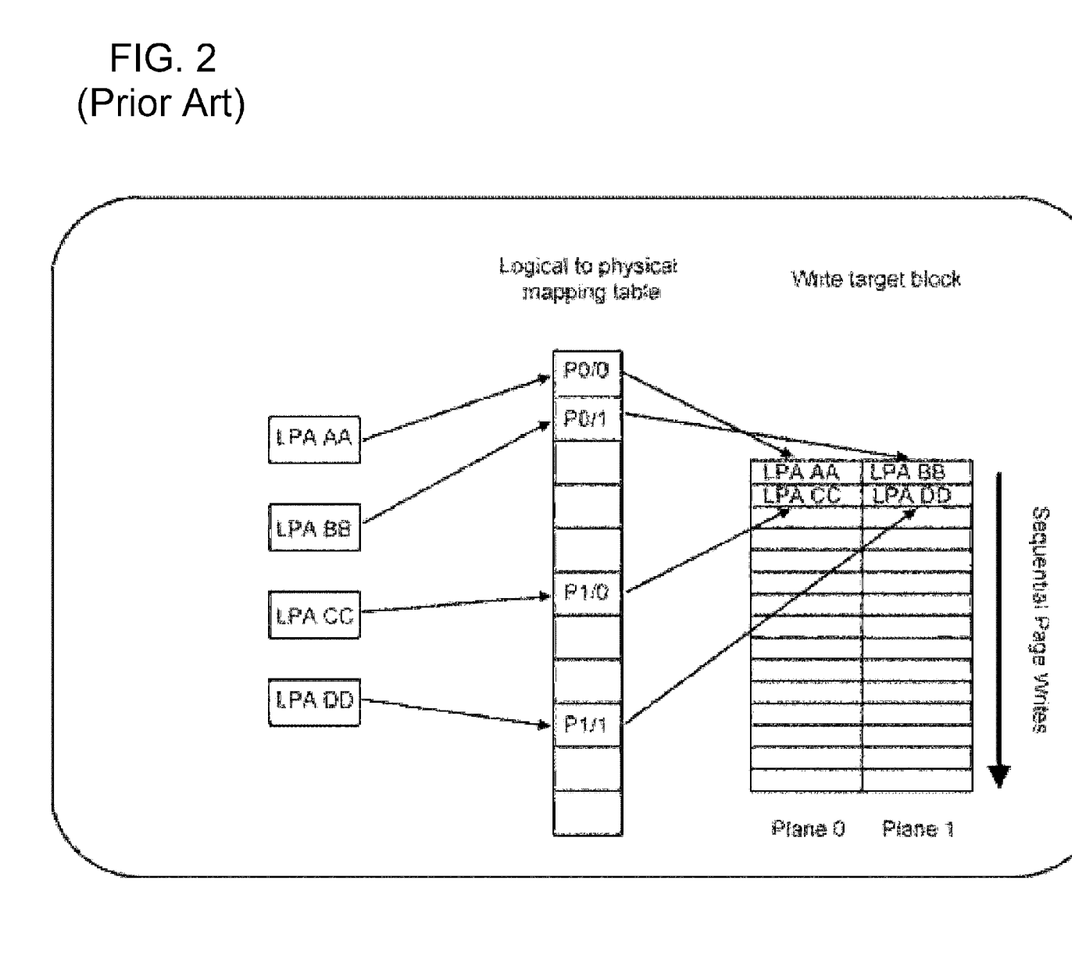
FIG. 2 represents a mapping of logical page addresses (LPA) to physical addresses in a write target block of a dual plane NAND flash memory device.

A single channel device is represented in FIG. 2. Within such a single channel device, comprising a single channel NAND flash controller with a single NAND flash integrated circuit, an initial write access of data will select one block of the array as the write target block and then write all pages within this block in sequential page order. The data written by the file system to logical page addresses (LPA AA-DD) are stored in a buffer which performs the logical to physical mapping (page 0/plane 0; P0/0) and commits the data to the lowest available page address in the write target block, which can be a single plane block or, as shown in the illustration, be configured as a dual plane block. In an empty or fresh block the starting physical page address will be page 0 and plane 0 (P0/0). When all pages in the write target block are filled, a new, empty block is selected as the next write target. It is important to notice that a new write target block is only selected if no pages are left in the previous block. This means that at any given time, within the array of flash blocks, all blocks are either full or empty and only one single block is in the process of filling up. This scheme applies to host writes as well as for internal data movement for the purpose of refresh or space reclamation and garbage collection.

Arguably, there are exceptions to this simplified rule in that, for example, some blocks are used to store meta data about the actual user data, however, in the context of the present invention, those special blocks are not relevant.

Figure 3:
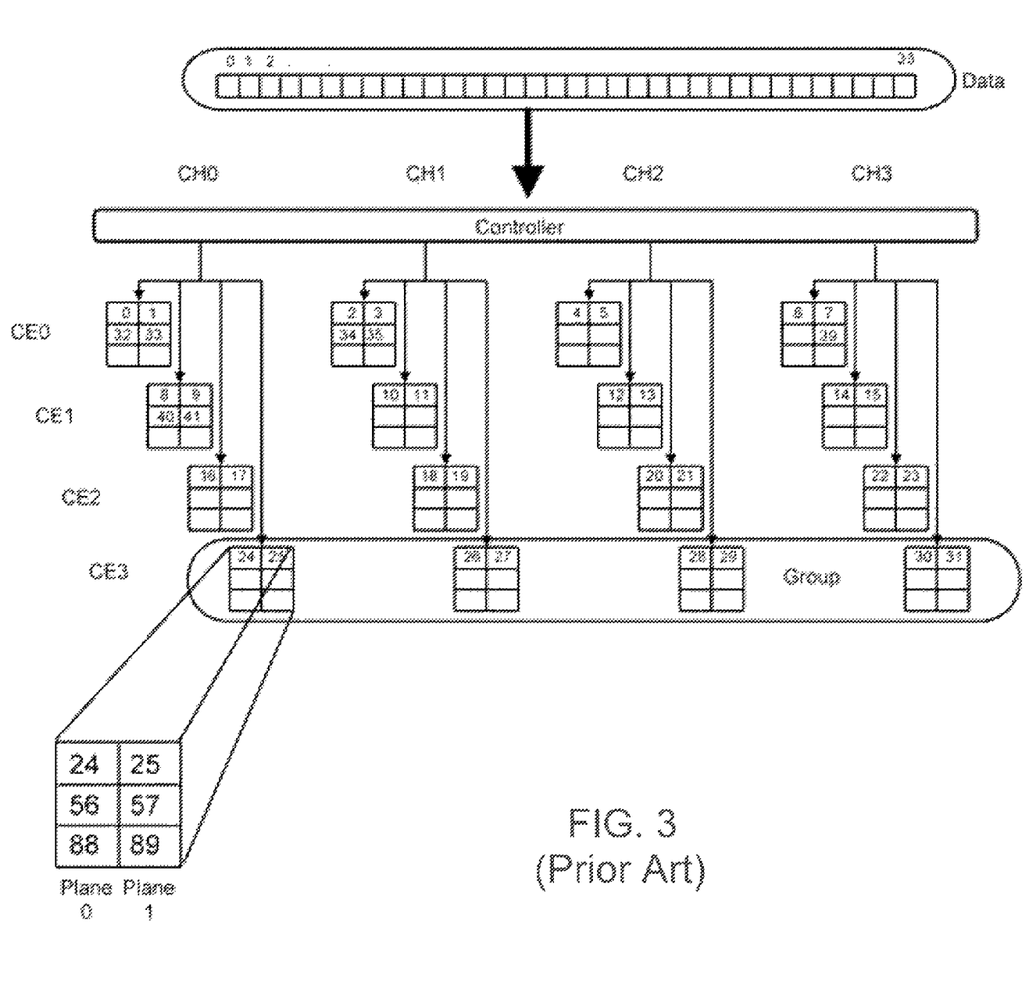
FIG. 3 represents a round-robin scheme of storing a contiguous chunk of data across four channels with four chip enable (CE) lines to enable four discrete dual plane NAND flash memory integrated circuits per channel.

An exemplary four-channel device is represented in FIG. 3. If multiple channels of flash are used in parallel, the workload is split across all channels in that the first page is written to the first NAND flash integrated circuit on channel 0 (channel 0, chip enable 0; CE0), the next page to the first integrated circuit on channel 1 (channel 1, CE0) and so on until the entire group comprising all channels have been written to. At this point the cycle starts over and the next page is written to the next CE (CE1) on channel 0. However, the start of a new group write cycle has to wait until the last channel in any group has finished the write execution and generates a "DONE" interrupt. During this time, even if, for example, seven out of eight channels have completed the command, the seven channels have to wait for the running command to finish, which means that they will be sitting idle.

When random or small data sets are written to the flash array, then the individual pages of the respective write target blocks are simply written in a round robin scheme wherein only sub-maximal numbers of channels are active at any given moment. For example, in an eight-channel configuration, if three channels have been written to already, five additional page writes are necessary in order to bring all write targets back to the same page offset. As long as the subsequent writes constitute relatively small data followed by idle periods, there is a high chance that the write commands will fit into the "outstanding" channels, meaning that they will all be programmed in either LSB or MSB mode.

The situation is more complicated if relatively small amounts of data with partial utilization of the available channels in a group are followed by large amounts of sequential writes. For example, in FIG. 3, a chunk of data comprising 34 file system allocation units (0-33) is committed to the flash array. Each file system allocation unit corresponds to a page of the NAND flash memory integrated circuit. Since the end of the data chunk does not align with the group boundaries, two pages are written to CE0 of channel 0, which leaves six free pages with the same physical page address in the group. This physical page address is lower than the highest used physical page number in channel 0.

In this case, the sequential writes will start at the first available channel at page 34 and then wrap around to page 41 for full utilization of all channels regardless of whether the next available pages on the write target blocks are LSB or MSB pages. As a result, each write command will contain a mixture of LSB and MSB pages but will be forced to operate at MSB speed because the "DONE" interrupt can only be issued after all channels have completed the write cycle.

In view of the above, it can be appreciated that there are certain problems, shortcomings or disadvantages associated with the prior art, and that it would be desirable if an improved method were available for writing data to non-volatile solid state memory-based mass storage devices that was capable of at least partly overcoming or avoiding these problems, shortcomings or disadvantages.

BRIEF DESCRIPTION OF THE INVENTION

The present invention provides methods and devices suitable for improving write performance in a non-volatile solid state memory-based mass storage device such as a NAND flash-based solid state drive using multi-level cell flash technology in parallel channel architectures.

According to a first aspect of the invention, the non-volatile solid state mass storage device includes a substrate on which are mounted a NAND flash controller and an array of NAND flash memory integrated circuits. The NAND flash memory integrated circuits are organized into blocks comprising pages that contain cells and are adapted for storing more than one bit per cell including at least a first bit logically assigned to a first page and at least a second bit logically assigned to a second page, the second page being characterized by slower write times that the first page. Each of the NAND flash memory integrated circuits has at any given time a block that is a write target block wherein the write target blocks of the NAND flash memory integrated circuits are simultaneously accessible by a write command. The NAND flash controller is adapted to have several I/O channels, each functionally coupled to at least one of the NAND flash memory integrated circuits for parallel and simultaneous access of a group of the NAND flash memory integrated circuits in a single write cycle. The non-volatile solid state mass storage device has means for determining a lowest unused page number for each of the write target blocks in the group of NAND flash memory integrated circuits. The non-volatile solid state mass storage device has further means for programming a dummy write to at least a first of the write target blocks in a first of the NAND flash memory integrated circuits within the group of NAND flash memory integrated circuits if the lowest unused page number within the first write target block is lower than the lowest unused page number of a second of the write target blocks in a second of the NAND flash memory integrated circuits in the group of NAND flash memory integrated circuits.

According to a second aspect of the invention, a method is provided for improving write performance of a non-volatile solid state mass storage device that includes an array of NAND flash memory integrated circuits. The NAND flash memory integrated circuits are organized into blocks comprising pages that contain cells and are adapted for storing more than one bit per cell including at least a first bit logically assigned to a first page and at least a second bit logically assigned to a second page, the second page being characterized by slower write times that the first page. Each of the NAND flash memory integrated circuits has at any given time a block that is a write target block wherein the write target blocks of the NAND flash memory integrated circuits are simultaneously accessible by a write command. The non-volatile solid state mass storage device is adapted to have several I/O channels each functionally coupled to at least one of the NAND flash memory integrated circuits for parallel and simultaneous access of a group of the NAND flash memory integrated circuits in a single write cycle. The method includes determining a lowest unused page number for each of the write target blocks in the group of NAND flash memory integrated circuits and then programming a dummy write to at least a first of the write target blocks in a first of the NAND flash memory integrated circuits within the group of NAND flash memory integrated circuits if the lowest unused page number within the first write target block is lower than the lowest unused page number of a second of the write target blocks in a second of the NAND flash memory integrated circuits in the group of NAND flash memory integrated circuits.

According to a third aspect of the invention, a method is provided for improving write performance of a non-volatile solid state mass storage device that includes an array of NAND flash memory integrated circuits. The NAND flash memory integrated circuits are organized into blocks comprising pages that contain cells, and at least two types of pages and are adapted for storing more than one bit per cell, including at least a first bit logically assigned to a first type of page and at least a second bit logically assigned to a second type of page, the second type of page being characterized by slower write times that the first type of page. Each of the NAND flash memory integrated circuits has at any given time a block that is a write target block wherein the write target blocks of the NAND flash memory integrated circuits are simultaneously accessible by a write command. The non-volatile solid state mass storage device is adapted to distinguish between the at least two types of pages and to have several I/O channels each functionally coupled to at least one of the NAND flash memory integrated circuits for parallel and simultaneous access of a group of the NAND flash memory integrated circuits in a single write cycle. The method includes first determining a lowest unused page number for each of the write target blocks in the group of NAND flash memory integrated circuits, associating the page with the lowest unused page number for each of the write target blocks in the group of NAND flash memory integrated circuits with a type of page, and then programming a dummy write to at least a first of the write target blocks in a first of the NAND flash memory integrated circuits if the page with the lowest unused page number of the first write target block belongs to a different type of page than the lowest unused page in a second of the write target blocks in a second of the NAND flash memory integrated circuits within the group of NAND flash memory integrated circuits.

According to a fourth aspect of the invention, a method is provided for improving write performance of a non-volatile solid state mass storage device that includes an array of NAND flash memory integrated circuits. The NAND flash memory integrated circuits are organized into blocks comprising pages that contain cells and are adapted for storing more than one bit per cell including at least a first bit logically assigned to a first page and at least a second bit logically assigned to a second page, the second page being characterized by slower write times that the first page. Each of the NAND flash memory integrated circuits has at any given time a block that is a write target block wherein the write target blocks of the NAND flash memory integrated circuits are simultaneously accessible by a write command. The non-volatile solid state mass storage device is adapted to have several I/O channels each functionally coupled to at least one of the NAND flash memory integrated circuits for parallel and simultaneous access of a group of the NAND flash memory integrated circuits in a single write cycle. The method includes first determining a lowest unused page number for each of the write target blocks in the group of NAND flash memory integrated circuits, and then during a first write cycle, writing to at least a first of the write target blocks in a first of the NAND flash memory integrated circuits within the group of NAND flash memory integrated circuits if the lowest unused page number within the first write target block is lower than the lowest unused page number of a second of the write target blocks in a second of the NAND flash memory integrated circuits in the group of NAND flash memory integrated circuits and not writing to the second write target block.

A technical effect of this invention is an improved write performance in a non-volatile solid state memory-based mass storage device such as a NAND flash-based solid state drive using multi-level cell flash technology in parallel channel architectures by synchronizing the lowest used page numbers of all simultaneously accessed channels to allow for full utilization of all channels.

Other aspects of the invention will be better understood from the following detailed description.

DETAILED DESCRIPTION OF THE INVENTION

The present invention discloses an apparatus and methods for improving write performance of a solid state mass storage device such as a NAND flash-based solid state drive using multi-level cell flash technology in parallel channel architectures.

Figure 4:
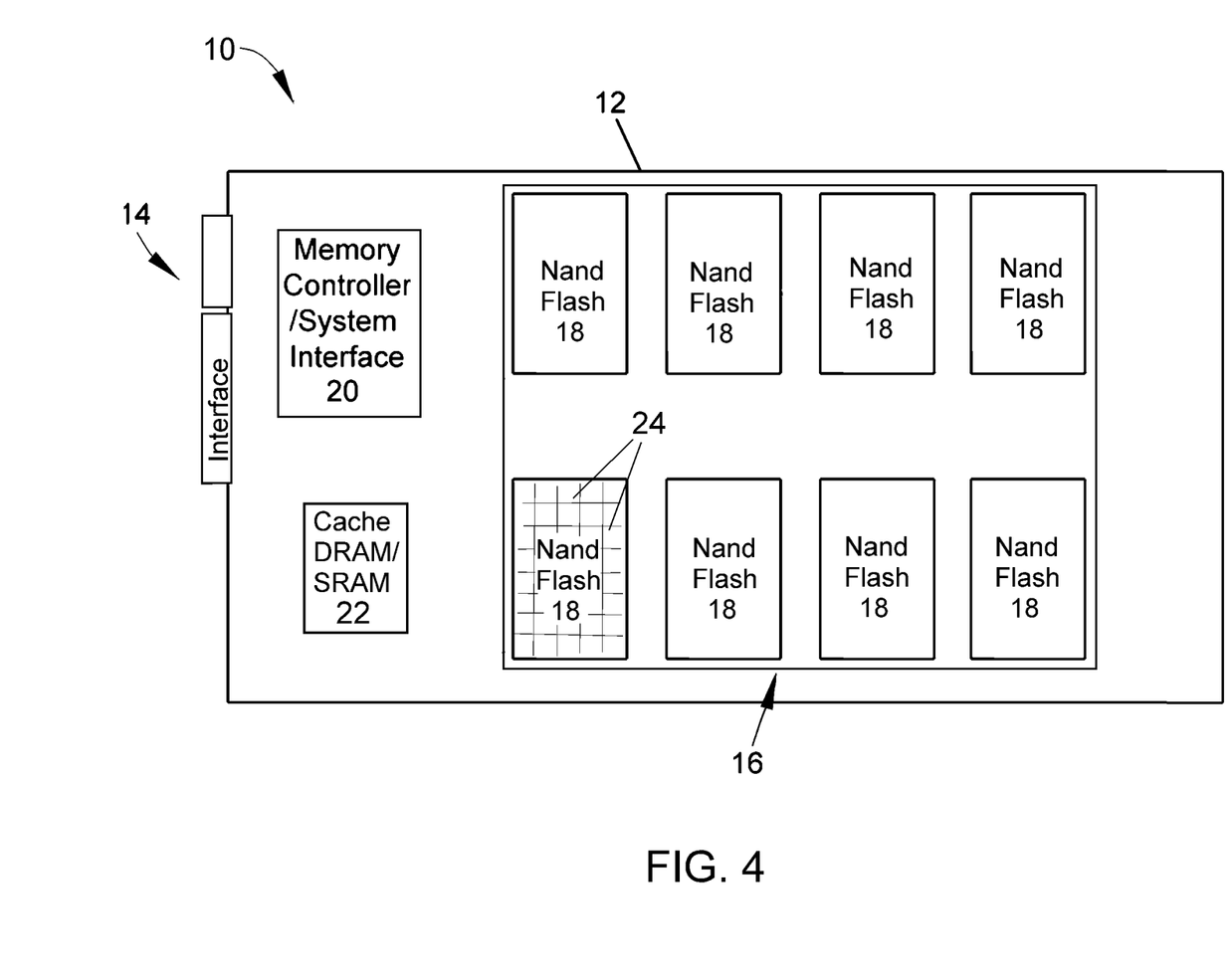
FIG. 4 represents a NAND flash memory-based device in accordance with one embodiment of the present invention.

A non-limiting example of a NAND flash-based mass storage device 10 in accordance with one embodiment of the present invention is represented in FIG. 4, though it should be understood that mass storage devices utilizing nonvolatile memory devices and having other than the classic "drive" form factor are also within the scope of this invention. The storage device 10 is represented as being configured as an internal mass storage device for a computer or other host system (not shown) equipped with a data and control bus for interfacing with the storage device 10. The bus may operate with any suitable protocol in the art, preferred examples being the advanced technology attachment (ATA) bus in its parallel or serial iterations, fiber channel (FC), small computer system interface (SCSI), and serially attached SCSI (SAS), as well as direct PCI (peripheral component interconnect) and PCIe (PCI Express) access.

As known in the art, the storage device 10 is adapted to be accessed by the host system with which it is interfaced. In FIG. 4, this interface is through a connector (host) interface 14 carried on a drive package that includes a substrate 12. Access is initiated by the host system for the purpose of storing (writing) data to (programming) and retrieving (reading) data from an array of solid-state nonvolatile memory components 16, each being a memory integrated circuit (IC) 18 chip carried on the substrate 12. The integrated circuits 18 are NAND flash memory components that allow data to be stored and retrieved on a page by page basis and erased on a block-by-block basis. FIG. 4 schematically represents memory blocks 24 located within two of the memory integrated circuits 18, though it should be understood that memory blocks 24 are present within each memory integrated circuit 18 of the storage device 10. The memory integrated circuits 18 are preferably accessed in parallel by a memory controller/system interface (controller) 20, through which data pass when being written to and read from the memory integrated circuits 18. The memory blocks 24 are further organized into pages. The memory integrated circuits 18 may be MLC or TLC flash memory adapted for storing more than one bit per cell including at least a first bit logically assigned to a first page and at least a second bit logically assigned to a second page, the second page being characterized by slower write times that the first page.

The controller 20 may comprise, for example, a host bus interface decoder and a memory controller capable of addressing the array of memory components 16 of memory integrated circuits 18. Protocol signals received through the interface 14 are translated by an abstraction layer of the controller 20 from logical to physical addresses on the memory integrated circuits 18 to which the data are written or from which they are read. The controller 20 also addresses a volatile memory cache chip 22 integrated on the storage device 10. The cache chip 22 may be, for example, DRAM or SRAM-based, as known in the art. Alternatively, the cache memory of the storage device 10 may be integrated on the controller 20, as also known in the art. The controller 20 further comprises a plurality of I/O channels each functionally coupled to at least one memory integrated circuit 18 for parallel and simultaneous access of several memory integrated circuits 18.

Figure 5:
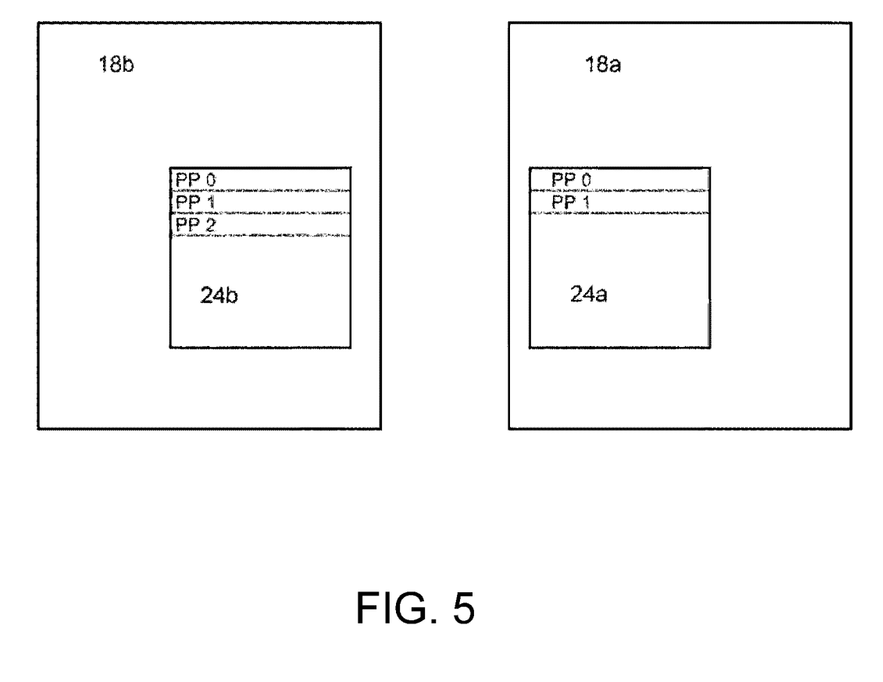
FIG. 5 represents a first NAND flash memory-based integrated circuit and a second NAND flash memory-based integrated circuit in accordance with one embodiment of the present invention.
Figure 6:
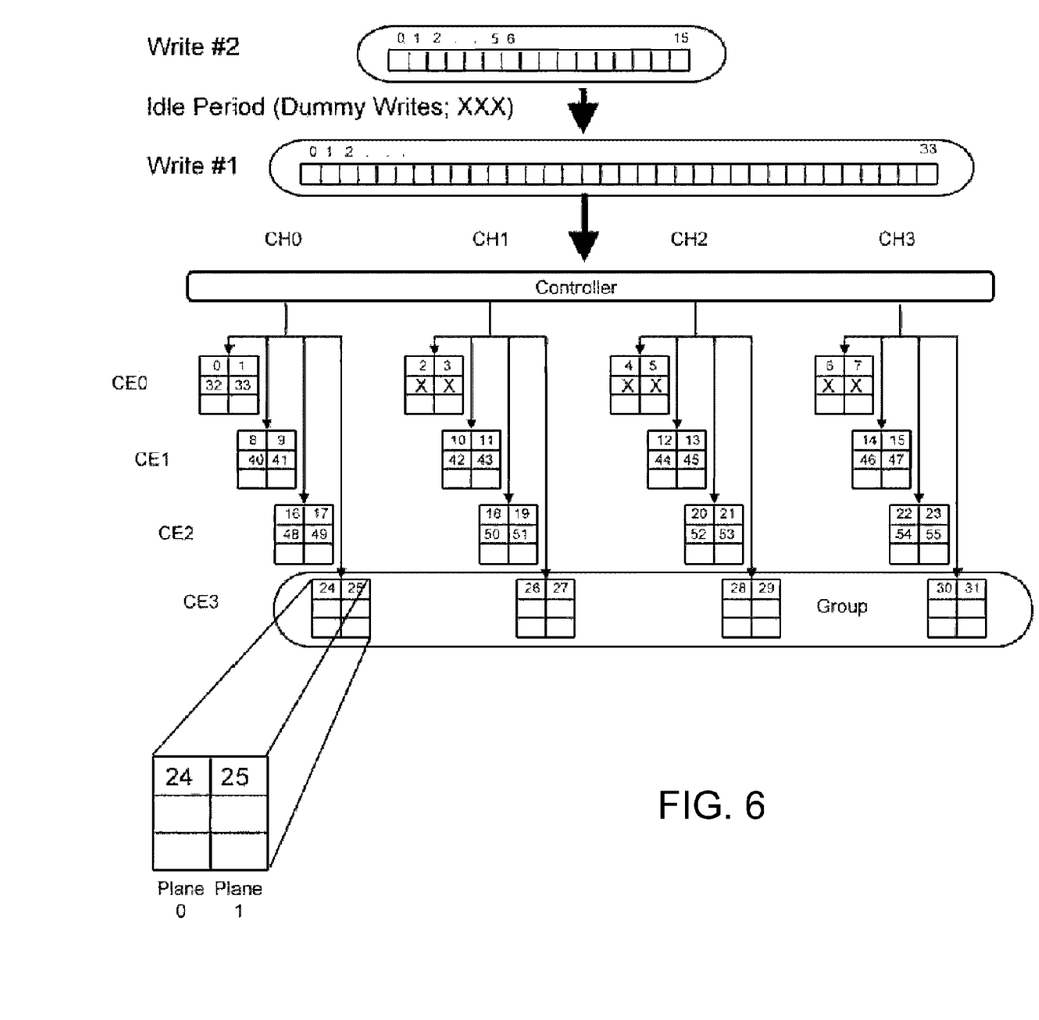
FIG. 6 represents a round-robin scheme of FIG. 3 with dummy writes programmed into unused pages using idle periods between consecutive write commands in accordance with one embodiment of the present invention.

In accordance with one aspect of the present invention, the controller 20 is adapted to determine the highest used page number or lowest unused page number of the write target blocks 24 which are accessible simultaneously during a write command. The task of determining the highest used page number or lowest unused page number is known in the art and generally done on the level of the block information record; however, it is foreseeable that one skilled in the art may accomplish this task by other means. If there is a discrepancy in the used page numbers across the group of simultaneously accessed memory blocks 24, the controller 20 may program unused pages of the write target blocks 24 in some of the memory integrated circuits 18 with dummy writes in order to synchronize the unused page numbers across all write target blocks 24 in the group. For example, in FIG. 5, if the highest used page number of a write target block 24a in memory integrated circuit 18a is determined to be smaller than the highest used page number of a write target block 24b in memory circuit 18b, the controller 20 may program write target block 24a with dummy writes to synchronize it with write target block 24b. FIG. 6 represents the same configuration as FIG. 3 wherein the dummy writes, represented by "X", are programmed in unused pages to synchronize the partially filled memory blocks 24. In this context, a dummy write constitutes a write command of data that do not correspond to data transferred from the host to the storage device or are not mapped to the file system and therefore don't exist on the level of the host file system. After the unused page numbers have been synchronized, the controller 20 may utilize all I/O channels at once in subsequent write cycles, thereby increasing the write performance of the storage device 10.

Figure 7:
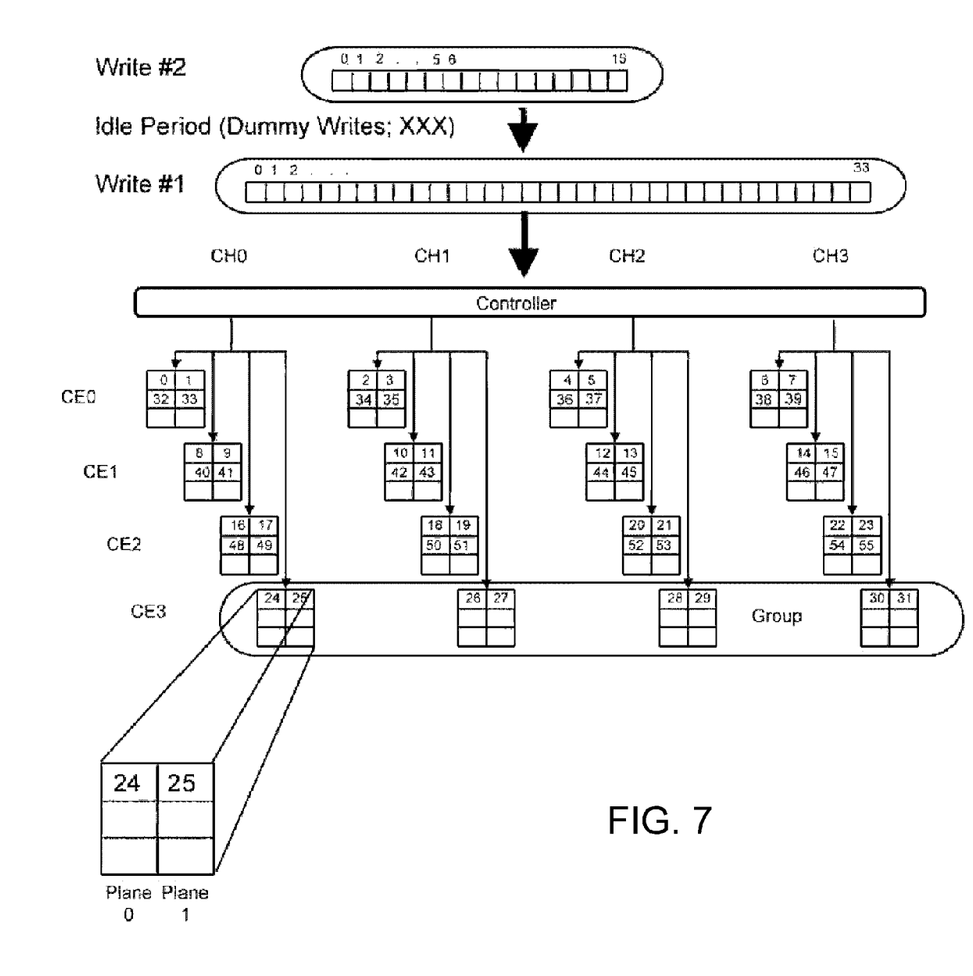
FIG. 7 represents a round-robin scheme of FIG. 3 with partial channel utilization on an initial program cycle of a write command following incomplete utilization of a group during a preceding write command in accordance with one embodiment of the present invention.

In accordance with a preferred aspect of the present invention, one method of synchronizing the unused page numbers across all write target blocks 24 within all memory integrated circuits 18 may be by starting a sequential write transfer at the first "outstanding" channel but not wrap around to the next chip enable (CE) on a first channel and rather use partial channel utilization instead. For example, in reference to FIG. 7, only pages 34-39 are written as a first group in a first write cycle committing allocation units 0-5 of a second write command. This strategy will incur an initial lag in performance, which, however, is limited to a single cycle, after which all channels will be utilized in a mutually exclusive LSB or MSB mode for committing allocation units 6-22 of the second write command and, therefore will maximize the write performance of the storage device 10.

In the case of space reclamation and garbage collection, the same principles apply as in the case of host writes, that is, valid data from partially invalidated memory blocks 24 are read into a buffer, which can be either a dedicated reclaim buffer or else a generic buffer with mixed reclaim and host (user) data buffer functionality. The valid data are then recombined and, if available, supplemented with incoming host writes and subsequently written in a distributed manner across the available channels according to the principles discussed above.

Preferably, the controller 20 maintains the same page offset within each write target block 24. As a result, all pages written to in parallel across multiple channels will use the same page number, which translates into all pages written to falling into the same LSB or MSB group. If a data set written to the NAND flash devices is larger than the sum of free pages across the combined channels, the sequential accesses will stay within the original memory blocks 24 until those memory blocks 24 are filled, before new memory blocks 24 are selected as write targets. Upon initialization or during idle periods of the storage device 10, the controller 20 sweeps the different memory blocks 24 and commits dummy writes to create the same page offset across all partially filled memory blocks 24 belonging to a group, as represented in FIG. 6.

The above method may be performed by creating a virtual super-block comprising all write target blocks 24. The controller 20 may perform a scan of all memory blocks 24 across all channels within the superblock on power up and match the highest page number offset of any memory block 24 among the channels by executing dummy writes to the outstanding channels. Such super-block may comprise all chip enables (CE) on all channels.

Alternatively or in addition to the above, during initialization of the solid state mass storage device, when coming out of sleep mode or during periods of idle, the controller 20 may check the page number offset of all write target blocks 24 within the flash integrated circuits on the individual channels. If a page number offset mismatch exists between write target blocks 24, the page number offset may be adjusted using dummy writes to memory blocks 24 having a lower offset until the write target block 24 of each channel has reached the same number as that of the flash integrated circuit with the highest page number offset in any of the channels. Preferably, only the pages within a group, that is, the same CE across all channels are adjusted to the highest used page number using dummy writes.

In the case of a multi-level cell technology-based solid state mass storage device 10 adapted to store more than one bit per cell, the controller may be configured to be aware of the page pairing pattern between corresponding types of pages, for example, lower and upper pages. The controller 20 may perform an analysis of the offset in each write target block 24 to determine the lowest programming load necessary to adjust the page number offset to homotypic pages, that is pages that are in the same programming mode and at the same position within each pair or group, characterized by even or odd page numbers or additional parameters. This can be done using a simple lookup reference table of the page pairing scheme that is programmed into the firmware depending on the NAND flash design used in the storage device 10. The controller 20 may then adjust the offset of pages within write target blocks 24 in such manner that all pages are at a comparable offset. Comparable offset in this case defines a first or higher number within a sequence of pages. For example, all offsets can be adjusted to have the write target block 24 offset start at the even page number within a pair of LSB or MSB pages. This scenario could primarily benefit SSDs that are almost full and where some channels have not been utilized because no free blocks were available. To increase efficiency, the offset matching may further be performed at any time when the drive comes out of sleep mode or during idle periods.

While the invention has been described in terms of specific embodiments, it is apparent that other forms could be adopted by one skilled in the art. For example functionally equivalent memory technology may supersede the NAND flash memory taught in this disclosure or higher numbers of bit could be stored in each cell. Therefore, the scope of the invention is to be limited only by the following claims.

The invention claimed is:

1. A non-volatile solid state mass storage device comprising:
   a substrate;
   an array of NAND flash memory integrated circuits mounted on the substrate, wherein the NAND flash memory integrated circuits are organized into blocks comprising pages that contain cells and are adapted for storing more than one bit per cell including at least a first bit logically assigned to a first page and at least a second bit logically assigned to a second page, the second page being characterized by slower write times that the first page, wherein each of the NAND flash memory integrated circuits has at any given time a block that is a write target block wherein the write target blocks of the NAND flash memory integrated circuits are simultaneously accessible by a write command;
   a NAND flash controller adapted to have several I/O channels each functionally coupled to at least one of the NAND flash memory integrated circuits for parallel and simultaneous access of a group of the NAND flash memory integrated circuits in a single write cycle;
   means for determining a lowest unused page number for each of the write target blocks in the group of NAND flash memory integrated circuits;
   means for programming a dummy write to at least a first of the write target blocks in a first of the NAND flash memory integrated circuits within the group of NAND flash memory integrated circuits if the lowest unused page number within the first write target block is lower than the lowest unused page number of a second of the write target blocks in a second of the NAND flash memory integrated circuits in the group of NAND flash memory integrated circuits.

2. The non-volatile solid state mass storage device according to claim 1, wherein the non-volatile solid state mass storage device is adapted to perform the determining of the lowest unused page numbers and programming of dummy writes during or immediately after initialization of the non-volatile solid state mass storage device.

3. The non-volatile solid state mass storage device according to claim 1, wherein the non-volatile solid state mass storage device is adapted to perform the determining of the lowest unused page numbers and programming of dummy writes during or immediately after power-up of the non-volatile solid state mass storage device.

4. The non-volatile solid state mass storage device according to claim 1, wherein the non-volatile solid state mass storage device is adapted to perform the determining of the lowest unused page numbers and programming of dummy writes immediately after waking up from sleep mode.

5. The non-volatile solid state mass storage device according to claim 1, wherein the non-volatile solid state mass storage device is adapted to perform the determining of the lowest unused page numbers and programming of dummy writes during idle periods of the non-volatile solid state mass storage device.

6. A method of improving write performance of a non-volatile solid state mass storage device comprising an array of NAND flash memory integrated circuits, wherein the NAND flash memory integrated circuits are organized into blocks comprising pages that contain cells and are adapted for storing more than one bit per cell including at least a first bit logically assigned to a first page and at least a second bit logically assigned to a second page, the second page being characterized by slower write times that the first page, wherein each of the NAND flash memory integrated circuits has at any given time a block that is a write target block wherein the write target blocks of the NAND flash memory integrated circuits are simultaneously accessible by a write command, wherein non-volatile solid state mass storage device is adapted to have several I/O channels each functionally coupled to at least one of the NAND flash memory integrated circuits for parallel and simultaneous access of a group of the NAND flash memory integrated circuits in a single write cycle, the method comprising:
   determining a lowest unused page number for each of the write target blocks in the group of NAND flash memory integrated circuits;
   programming a dummy write to at least a first of the write target blocks in a first of the NAND flash memory integrated circuits within the group of NAND flash memory integrated circuits if the lowest unused page number within the first write target block is lower than the lowest unused page number of a second of the write target blocks in a second of the NAND flash memory integrated circuits in the group of NAND flash memory integrated circuits.

7. The method according to claim 6, wherein determining of the lowest unused page numbers and programming of dummy writes is performed during or immediately after initialization of the non-volatile solid state mass storage device.

8. The method according to claim 6, wherein determining of the lowest unused page numbers and programming of dummy writes is performed during or immediately after power-up of the non-volatile solid state mass storage device.

9. The method according to claim 6, wherein determining of the lowest unused page numbers and programming of dummy writes is performed immediately after waking up from sleep mode.

10. The method according to claim 6, wherein determining of the lowest unused page numbers and programming of dummy writes is performed during idle periods of the non-volatile solid state mass storage device.

11. A method of improving write performance of a non-volatile solid state mass storage device comprising an array of NAND flash memory integrated circuits, wherein the NAND flash memory integrated circuits are organized into blocks comprising at least two types of pages that contain cells and are adapted for storing more than one bit per cell, including at least a first bit logically assigned to a first type of page and at least a second bit logically assigned to a second type of page, the second type of page being characterized by slower write times that the first type of page, wherein each of the NAND flash memory integrated circuits has at any given time a block that is a write target block wherein the write target blocks of the NAND flash memory integrated circuits are simultaneously accessible by a write command, wherein the non-volatile solid state mass storage device is adapted to distinguish between the at least two types of pages and to have several I/O channels each functionally coupled to at least one of the NAND flash memory integrated circuits for parallel and simultaneous access of a group of the NAND flash memory integrated circuits in a single write cycle, the method comprising:
   determining a lowest unused page number for each of the write target blocks in the group of NAND flash memory integrated circuits;
   associating the page with the lowest unused page number of each of the write target blocks in the group of NAND flash memory integrated circuits with a type of page; and then,
   programming a dummy write to at least a first of the write target blocks in a first of the NAND flash memory integrated circuits if the page with the lowest unused page number of the first write target block belongs to a different type of page than the lowest unused page in a second of the write target blocks in a second of the NAND flash memory integrated circuits within the group of NAND flash memory integrated circuits.

12. The method according to claim 11, wherein the page the lowest unused number is associated with a page type by comparing the lowest unused page number of each of the write target blocks against a page pairing reference for the NAND flash memory integrated circuits.

13. The method according to claim 11, wherein determining the lowest unused page number, associating the page with a type of page, and programming of dummy writes is performed during or immediately after initialization of the non-volatile solid state mass storage device.

14. The method according to claim 11, wherein determining the lowest unused page number, associating the page with a type of page, and programming of dummy writes is performed during or immediately after power-up of the non-volatile solid state mass storage device.

15. The method according to claim 11, wherein determining the lowest unused page number, associating the page with a type of page, and programming of dummy writes is performed immediately after waking up from sleep mode.

16. The method according to claim 11, wherein determining the lowest unused page number, associating the page with a type of page, and programming of dummy writes is performed during idle periods of the non-volatile solid state mass storage device.

17. A method of improving write performance of a non-volatile solid state mass storage device comprising an array of NAND flash memory integrated circuits, wherein the NAND flash memory integrated circuits are organized into blocks comprising pages that contain cells and are adapted for storing more than one bit per cell including at least a first bit logically assigned to a first page and at least a second bit logically assigned to a second page, the second page being characterized by slower write times that the first page, wherein each of the NAND flash memory integrated circuits has at any given time a block that is a write target block wherein the write target blocks of the NAND flash memory integrated circuits are simultaneously accessible by a write command, wherein the non-volatile solid state mass storage device is adapted to have several I/O channels each functionally coupled to at least one of the NAND flash memory integrated circuits for parallel and simultaneous access of a group of the NAND flash memory integrated circuits in a single write cycle, the method comprising:
   determining a lowest unused page number for each of the write target blocks in the group of NAND flash memory integrated circuits;
   during a first write cycle, writing to at least a first of the write target blocks in a first of the NAND flash memory integrated circuits within the group of NAND flash memory integrated circuits if the lowest unused page number within the first write target block is lower than the lowest unused page number of a second of the write target blocks in a second of the NAND flash memory integrated circuits in the group of NAND flash memory integrated circuits and not writing to the second write target block.

18. The method according to claim 17, wherein all write target blocks have the same lowest unused page number after the first write cycle.

19. The method according to claim 17, wherein all subsequent write cycles can use all I/O channels simultaneously after the first write cycle.

* * * * *